US009437692B2

(12) United States Patent
James et al.

(10) Patent No.: US 9,437,692 B2
(45) Date of Patent: Sep. 6, 2016

(54) PRODUCTION AND DISTRIBUTION OF DILUTE SPECIES IN SEMICONDUCTING MATERIALS

(71) Applicant: Brookhaven Science Associates, LLC, Upton, NY (US)

(72) Inventors: Ralph B. James, Ridge, NY (US); Giuseppe Camarda, Shoreham, NY (US); Aleksey E. Bolotnikov, South Setauket, NY (US); Anwar Hossain, Port Jefferson Station, NY (US); Ge Yang, Moriches, NY (US); Kihyun Kim, Gyeonggi-do (KR)

(73) Assignee: Brookhaven Science Associates, LLC, Upton, NY (US)

( * ) Notice: Subject to any disclaimer, the term of this patent is extended or adjusted under 35 U.S.C. 154(b) by 245 days.

(21) Appl. No.: 14/063,819

(22) Filed: Oct. 25, 2013

(65) Prior Publication Data

US 2014/0117513 A1 May 1, 2014

Related U.S. Application Data

(60) Provisional application No. 61/718,613, filed on Oct. 25, 2012.

(51) Int. Cl.
| | | |
|---|---|---|
| *C30B 1/10* | (2006.01) | |
| *H01L 29/36* | (2006.01) | |
| *C30B 29/48* | (2006.01) | |
| *C30B 11/00* | (2006.01) | |

(52) U.S. Cl.
CPC ............... *H01L 29/36* (2013.01); *C30B 1/10* (2013.01); *C30B 11/00* (2013.01); *C30B 29/48* (2013.01)

(58) Field of Classification Search
CPC ............................... C30B 1/10; C30B 29/48
See application file for complete search history.

(56) References Cited

U.S. PATENT DOCUMENTS

| | | | | |
|---|---|---|---|---|
| 5,581,117 A | * | 12/1996 | Kawano | ............... C30B 23/02 |
| | | | | 250/370.12 |
| 2013/0269783 A1 | * | 10/2013 | Berg | ............... C23C 14/0623 |
| | | | | 136/264 |

OTHER PUBLICATIONS

Asahi, T., et al., "Characterization of 100mm Diameter CdZnTe Single Crystals Grown by the Vertical Gradient Freezing Method," *Journal of Crystal Growth*, vol. 149, pp. 23-29, 1995.
Cheuvart, P., et al., "CdTe and CdZnTe Crystal Growth by Horizontal Bridgman Technique," *Journal of Crystal Growth*, vol. 101, pp. 270-274, 1990.
Doty, F., et al., "Properties of CdZnTe Crystals Grown by a High Pressure Bridgman Method," *Journal of Vacuum Science & Technology B*, vol. 10, No. 4, pp. 1418 to 1422, 1992.

(Continued)

*Primary Examiner* — Robert M Kunemund
(74) *Attorney, Agent, or Firm* — Dorene M. Price

(57) ABSTRACT

Technologies are described effective to implement systems and methods of producing a material. The methods comprise receiving a tertiary semiconductor sample with a dilute species. The sample has two ends. The first end of the sample includes a first concentration of the dilute species lower than a second concentration of the dilute species in the second end of the sample. The method further comprises heating the sample in a chamber. The chamber has a first zone and a second zone. The first zone having a first temperature higher than a second temperature in the second zone. The sample is orientated such that the first end is in the first zone and the second end is in the second zone.

13 Claims, 5 Drawing Sheets

(56) References Cited

OTHER PUBLICATIONS

Edwards, K., et al., "Understanding Horizontal Bridgman Shelf Growth of Cadmium Telluride and Cadmium Zinc Telluride," *Journal of Crystal Growth*, vol. 179, pp. 133-143, 1997.

Funaki, M., et al., "Growth and Characterization of CdTe Single Crystals for Radiation Detectors," *Nuclear Instruments and Methods in Physics Research A*, vol. 436, pp. 120-126, 1999.

Hobgood, H., et al., "Czochralski Growth of CdTe and CdMnTe from Liquid Encapsulated Melts," *Journal of Crystal Growth*, vol. 85, pp. 510-520, 1987.

Lachish, U., "CdTe and CdZnTe Semiconductor Gamma Detectors Equipped with Ohmic Contacts," *Nuclear Instruments and Methods in Physics Research A*, vol. 436, pp. 146-149, 1999.

Li, Q., et al., "Growth of High Resistivity CdZnTe Crystals by Modified Bridgman Method," *Journal of Crystal Growth*, vol. 233, pp. 791-794, 2001.

Marchini, L., et al., "Characterization of CZT Crystals Grown by the Boron Oxide Encapsulated Vertical Bridgman Technique for the Preparation of X-ray Imaging Detectors," *Nuclear Instruments and Methods in Physics Research A*, vol. 633, pp. S92 to S94, 2011.

Mycielski, A., et al., "Parameters of Substrates-Single Crystals of ZnTe and $Cd_{1-x}Zn_xTe$ (x <0.25), Obtained by Physical Vapor Transport Technique (PVT)," *Journal of Crystal Growth*, vol. 197, pp. 423-426, 1999.

Parnham, K., "Recent Progress in $Cd_{1-x}Zn_xTe$ Radiation Detectors," *Nuclear Instruments and Methods in Physics Research A*, vol. 377, pp. 487-491, 1996.

Raiskin, E., et al., "CdTe Low Level Gamma Detectors Based on a New Crystal Growth Method," *Institute of Electrical and Electronics Engineers Transactions on Nuclear Science*, vol. 35, No. 1, pp. 81-84, 1988.

"Semiconductor for Room Temperature Nuclear Detectors Applications," in *Semiconductor and Sentimetal Series* vol. 43, Schlesinger, T. and James, R., eds., (Academic Press, New York), pp. 1-593, 1995, with title page and bibliographic page.

Szeles, C., et al., "Advances in the Crystal Growth of Semi-Insulating CdZnTe for Radiation Detector Applications," *Institute of Electrical and Electronics Engineers Transactions on Nuclear Science*, vol. 49, No. 5, pp. 2535 to 2540, 2002.

Triboulet, R., "The Travelling Heater Method (THM) for $Hg_{1-x}Cd_xTe$ and Related Materials," *Progress in Crystal Growth and Characterization of Materials*, vol. 28, pp. 85-144, 1994.

Triboulet, R., et al., "Growth and Characterization of the Complete $Cd_{1-x}Zn_xTe$ Alloy Series," *Journal of Crystal Growth*, vol. 65, pp. 262-296, 1983.

Willardson, R., et al., "Foreword," in *Semiconductors and Semimetals, Cadmium Telluride*, vol. 13, Zanio, K., (Academic Press, New York), pp. vii, 1978, with title page and bibliographic page.

\* cited by examiner

PRODUCTION AND DISTRIBUTION OF DILUTE SPECIES IN SEMICONDUCTING MATERIALS

CROSS REFERENCE TO RELATED APPLICATIONS

This application claims priority to U.S. provisional application 61/718,613 filed Oct. 25, 2012 entitled "Methods of Controlling Zinc Segregation and Distribution in Semiconducting Materials", the entirety of which is hereby incorporated by reference.

The present application was made with Government support under contract number DE-AC02-98CH10886 awarded by the U.S. Department of Energy. The Government has certain rights in the application.

FIELD OF THE INVENTION

This application relates to the manufacture of devices for the detection of high-energy electromagnetic radiation.

BACKGROUND

Semiconductor nuclear radiation detectors are used in a large variety of fields, including nuclear physics, X-ray and gamma ray astronomy, and nuclear medicine. Such detectors may have good imaging capabilities, energy resolution, and the ability to be fabricated compactly. Compound semiconductors with wide band gap and high atomic number are used for X-ray and gamma ray detectors. The quality of crystals used for detectors can be improved, and precipitates can be avoided, by applying the modified Bridgman technique or by post-growth thermal annealing. In these procedures, a small cadmium excess is provided in an ampoule. During the modified Bridgman crystal growth process, one ampoule end is kept at a lower temperature that determines a nearly atmospheric constant vapor pressure in the system. The growth process involves continuous material transfer between the three phases. The constant vapor pressure keeps a constant liquid composition, and provides balanced amounts of cadmium and tellurium within the crystal. FIGS. 1A and 1B illustrate the horizontal and vertical versions of this technique without the presence of a Cd reservoir at the cold end. In both cases the crystal grows from the melt by moving along a region with a temperature gradient that extends from above to below the melting point. The growth may proceed by mechanically moving the ampoule or by moving the heating furnace. The growth procedure starts by melting the separate tellurium from cadmium and zinc loads. Often the compounding occurs under a hydrogen atmosphere in order to remove oxygen from the system. The materials are then brought into contact and heated until they react and produce CdZnTe source material used for crystal growth. The material can also be produced by compounding CdTe and ZnTe separately and mixing them into the desired proportions to produce CdZnTe ingots by the Bridgman growth technique.

SUMMARY

In an example, a method of producing a material is generally described. The method may comprise receiving a tertiary semiconductor sample with a dilute species. The sample has two ends. The first end of the sample includes a first concentration of the dilute species lower than a second concentration of the dilute species in the second end of the sample. The method further comprises heating the sample in a chamber. The chamber has a first zone and a second zone. The first zone has a first temperature higher than a second temperature in the second zone. The sample is orientated such that the first end is in the first zone and the second end is in the second zone.

In an example, a system effective to produce a material is generally described. The system may include a tertiary semiconductor sample. The sample has two ends. The first end of the sample includes a concentration of a dilute species lower than the concentration of the dilute species in the second end of the sample. The system further comprises a multi-zone furnace effective to heat the sample in a chamber. The chamber has a first zone and a second zone. The first zone has a temperature higher than a second temperature in the second zone. The sample is orientated such that the first end is in the first zone and the second end is in the second zone.

In an example, a material produced by a process is generally described. The process includes receiving a tertiary semiconductor sample with a dilute species. The sample has two ends. The first end of the sample includes a first concentration of the dilute species lower than a second concentration of the dilute species in the second end of the sample. The process further includes heating the sample in a chamber. The chamber has a first zone and a second zone. The first zone has a first temperature higher than a second temperature in the second zone. The sample is orientated such that the first end is in the first zone and the second end is in the second zone.

The objectives, features, and advantages of the present application will be apparent from the following detailed description of the disclosed application, which is to be read in conjunction with the accompanying drawings. The scope of the application will be pointed out in the claims.

DETAILED DESCRIPTION

Certain present embodiments are directed to (1) a method of producing a tertiary semiconducting material with minimal segregation of the dilute species, such as CdZnTe (CZT) with minimal Zn segregation, which has potential application in other multi-component compound semiconductors where the segregation coefficient of the dilute species is not equal to unity, (2) a method for improving uniformity in large-volume semiconducting detectors and substrates used for infrared detectors, and (3) a method for processing CZT surfaces that rely on annealing the grown ingot employing a temperature gradient to control the speed and distribution of Zn in the semiconducting material. Generally, the methods have at least two steps: receiving a sample (crystal ingot or wafer) and annealing the sample employing a temperature gradient to control the speed and distribution of Zn within the sample.

The sample can be grown by one of a plurality of methods including, but not limited to, traveling heater method, vertical gradient freezing, high pressure Bridgman technique, electro-dynamic gradient technique, horizontal Bridgman, vertical Bridgman, floating zone, physical vapor transport, and Czochralski method.

Figure 1A:
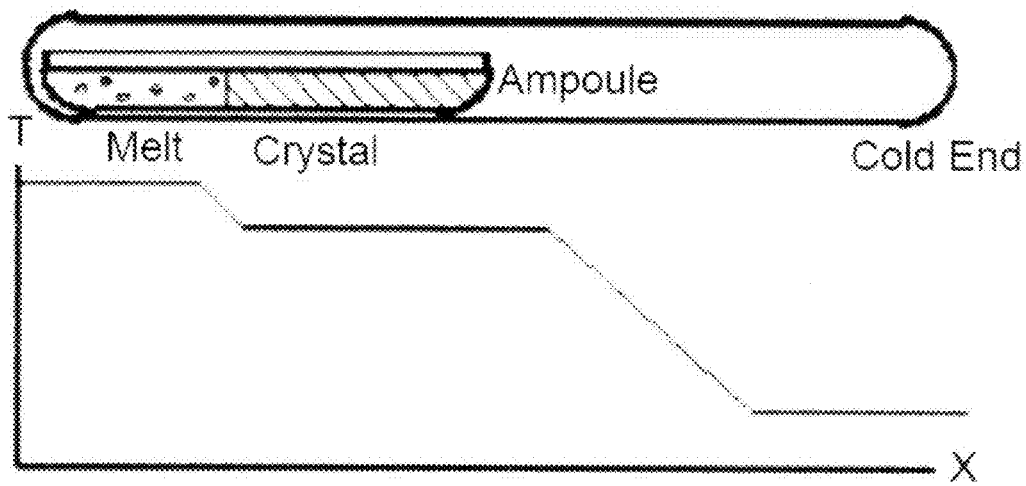
FIG. 1A is a setup of a horizontal Bridgman technique with the corresponding temperature (T) transition plot as a function of the furnace length (x).
Figure 1B:
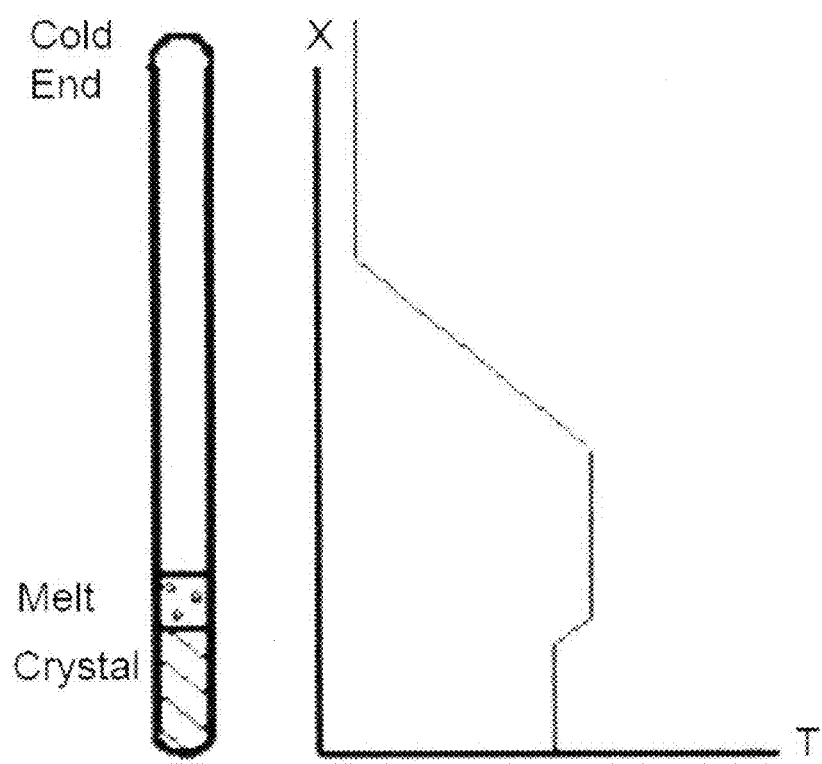
FIG. 1B is a setup of a vertical Bridgman technique with the corresponding temperature (T) transition plot as a function of the furnace length (x).
Figure 2:
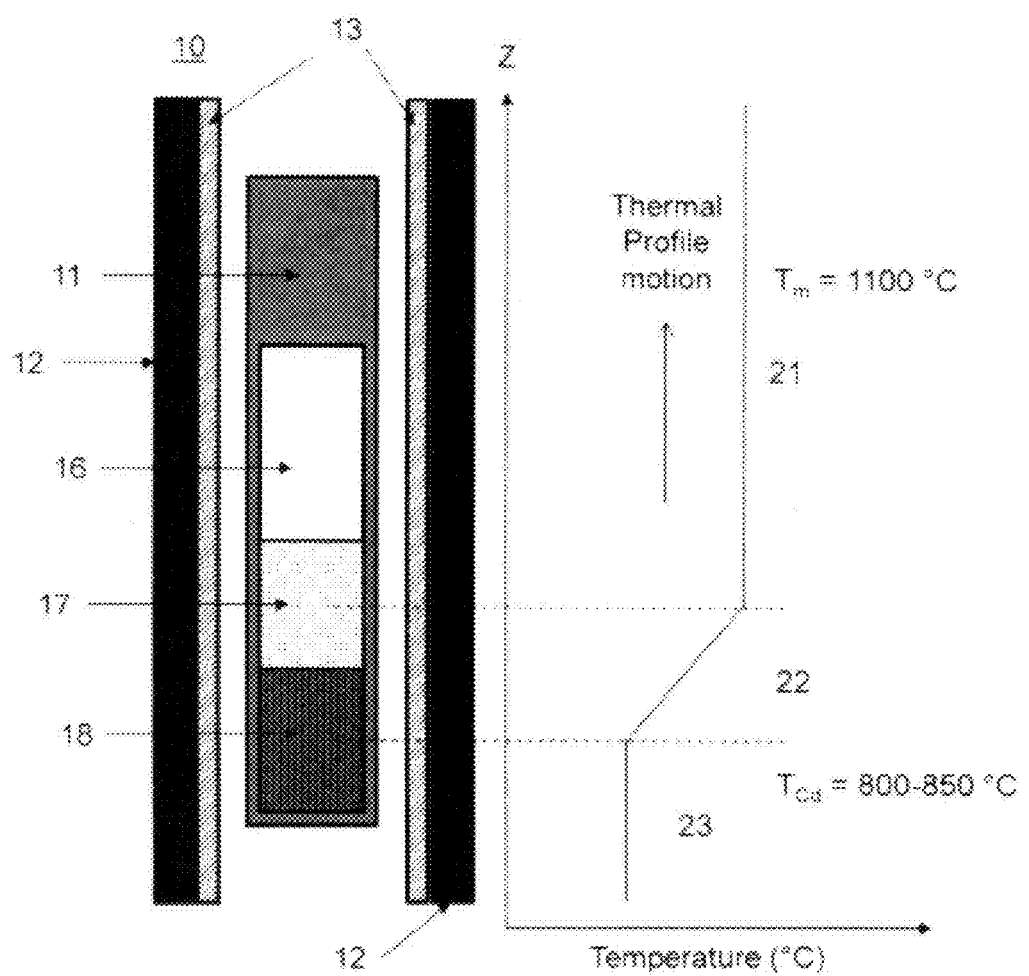
FIG. 2 is a schematic view of an exemplary furnace setup using a vertical Bridgman technique with its corresponding temperature (T) transition plot as a function of the furnace length (Z).

As illustrated in FIG. 2, a source material is grown into a crystal ingot sample. The source material could include Cd, Zn and either Te or Se. In some cases, dopants of indium, vanadium, gallium, or chlorine may be added at a concentration of $10^{16}$-$10^{19}$ cm$^{-3}$. In some examples, magnesium or manganese could be used in place of zinc. In a vertical Bridgman multi-zone furnace 10, the source material is enclosed in a quartz ampoule 11 that is moved relative to a multi-zone furnace 10. The main components of the furnace 10 are a heater 13, insulation 12, and an actuator (not shown). The furnace 10 may be a heating chamber that has two or more zones. First, a hot zone 21 where the source material is melted and has a temperature between 1000° C. and 1200° C., preferably about 1100° C. Second, a gradient zone 22 where solidification of the source material takes place. Typically, the axial temperature gradient of the furnace 10 in zone 22 is kept at 3-5° C./cm for the crystal growth, while the ampoule 11 is lowered at a rate of about 1 mm/h through the temperature gradient. The temperature-gradient region is located at a fixed position (e.g. Zone 22, FIG. 2). The ampoule is lowered down through this region during the growth. The temperature gradient is the same for starting and finishing, which is a value between 3 to 5° C./cm. Finally, the furnace 10 has a cold zone 23 where a crystal ingot 18 forms (the solidified section of the material). The temperature of cold zone 23 is lower than the melting point of CdZnTe (~1100° C.), preferably 800-850° C. Since the growth in this case is typically performed in quartz ampoule 11, which is evacuated and sealed at room temperature of about 20° C., an equilibrium is established between a melt 17 and a vapor phase 16, and there is no Cd loss from the melt 17 during the growth. A fine control of the CdZnTe (CZT) stoichiometry can be achieved by using a controlled Cd overpressure during the growth. This can be attained by an additional zone in furnace 10 and the extension of the quartz ampoule 11, where a Cd source is melted to provide the desired Cd vapor pressure in ampoule 11. The additional zone is an extended region of furnace 10, heated by separate heating elements, where the Cd reservoir of quartz ampoule 11 is put in to control the Cd vapor pressure. By appropriate variation of the Cd vapor pressure in various stages of the growth, it is possible to maintain near stoichiometry of Cd throughout ingot 18. Growth close to stoichiometry minimizes the incorporation of native defects, such as Cd vacancies (Te-rich growth) and Cd interstitials (Cd-rich growth) and can produce crystals with low free carrier concentration and relatively high resistivity.

Figure 3:
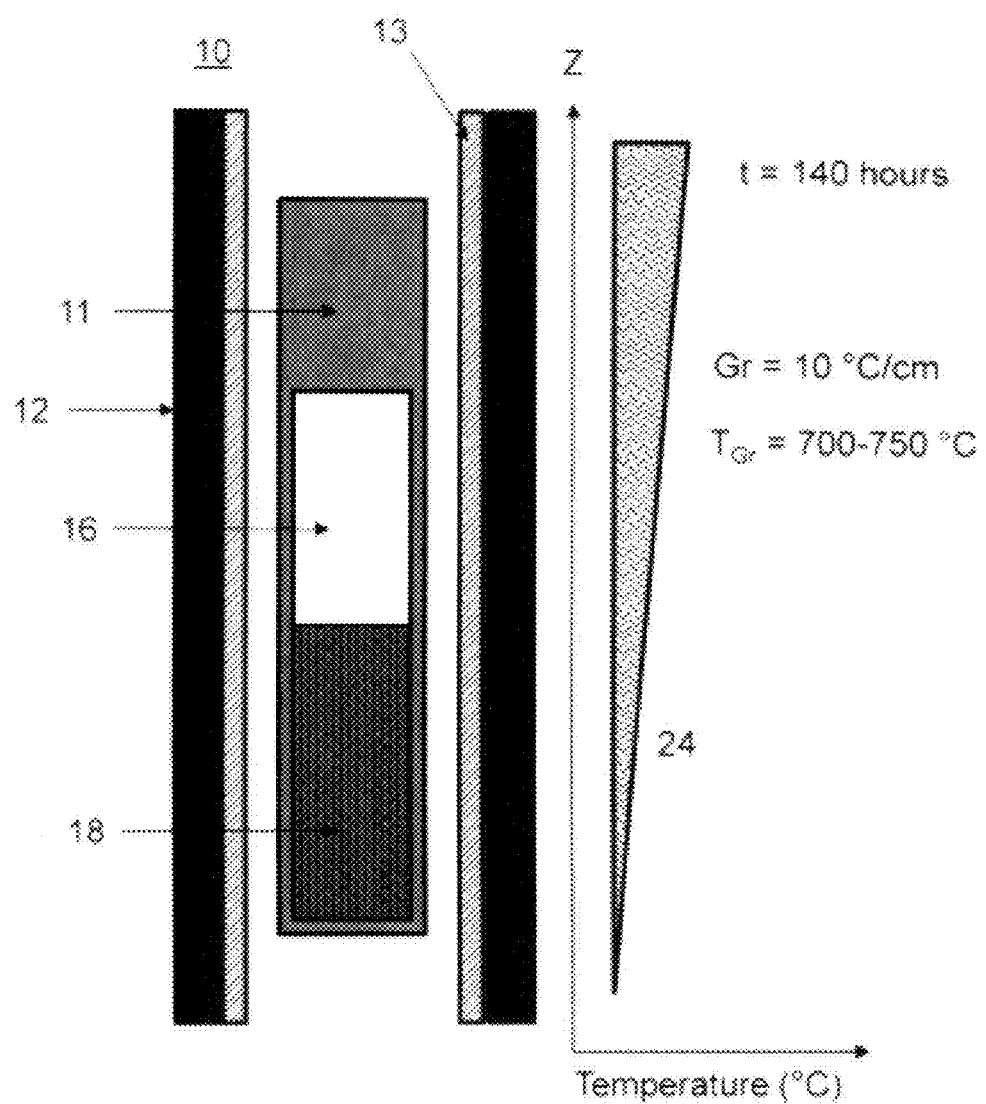
FIG. 3 is a schematic view of an exemplary furnace setup for gradient annealing within the furnace of FIG. 2 with its corresponding temperature gradient as a function of the furnace length (Z).

Referring to FIG. 3, the sample may then be annealed in situ, preferably in the same furnace 10, although a separate annealing furnace or heating chamber may also be used. Annealing of the sample may be carried out to release the stress experienced by the sample during growth and to homogenize the distribution of zinc in the sample due to solid-state diffusion. The segregation coefficient of Zn in CdTe is higher than unity, which causes the Zn composition in CZT ingots to decrease by up to 5-6% from the first-to-freeze to last-to-freeze parts of an ingot. To control the speed and distribution of Zn in the CZT samples and, thereby, to avoid material segregation, the in situ annealing is carried out under a temperature gradient of about 2-20° C./cm at about 700-1000° C. average temperature for about 5-200 hours. In a preferred embodiment, the in situ annealing is carried out under a temperature gradient of about 10° C./cm at about 700-750° C. for about 140 hours. Furnace 10 may be a heating chamber and include a first and second zone. The first zone may have a temperature higher than the second zone. The difference in temperature between the first zone and the second zone may create a temperature gradient along the sample, and the difference in temperature between the first zone and the second zone may be about 50° C. By assuring the proper thermal environment, the speed of Zn migration and its final distribution in the material can be controlled. The method as described may be successfully applied to control Zn composition in CZT ingots as well as in CZT wafers.

After annealing, the annealed sample is then slowly cooled at the rate of 10-30° C./h down to room temperature of about 20° C. The controlled cooling may also reduce the thermo-elastic stress in the crystal.

The disclosed method can be applied in preparing large-volume, uniform CZT X- and gamma-ray-detectors and for generating large-area CZT substrates for growing HgCdTe epilayers for infrared detectors. The application of the temperature gradient during thermal annealing of CZT samples can also be used to remove Te-rich secondary phases since these secondary phases move toward the higher-temperature end of the wafer at a rate determined by the average temperature and temperature gradient. Here, the Te-rich material can be removed mechanically or by using chemicals to etch away the Te-rich CZT surface. The disclosed process may also impact methods to modify the zinc composition in and around extended defects, such as high-angle grain boundaries, twins and possible cellular networks, for as-grown CZT ingots and wafers. Such regions may also show relatively higher amounts of zinc compared to the surrounding single-crystal volumes due to their higher concentrations of cadmium vacancies.

Although the disclosed method has been described with reference to CZT, other cadmium-containing semiconductors, such as CdZnSe, may also be used. The semiconductor may be larger or smaller, and may vary in shape depending upon the design specifications. In one embodiment, the size of the semiconductor is limited by the availability of a single crystal of highly uniform compound semiconductor ingot. In another, non-limiting, embodiment, the semiconductor is about 6 mm by about 6 mm by 15 mm thick. In yet another, non-limiting, embodiment, the semiconductor is about 7 mm by 7 mm by 20 mm thick, or 5 mm by 5 mm and 10 mm to 12 mm thick.

Among other potential benefits, the gradient annealing process may also assist in removal of Te-rich secondary phases and the choice of chemical etchants for processing CZT surfaces. It may also impact the zinc composition in and around extended defects of the CZT ingots and wafers, such as high-angle grain boundaries, twins and possible cellular networks. These regions can show relatively higher amounts of zinc compared to the surrounding single-crystal volumes due to their higher concentrations of cadmium vacancies.

In one exemplary embodiment, the method is used to prepare large-volume, uniform CZT X- and gamma-ray-detectors. In another exemplary embodiment, the method is used to prepare large-area CZT substrates for growing HgCdTe epilayers for infrared detectors.

EXAMPLES

Example 1

Figure 4:
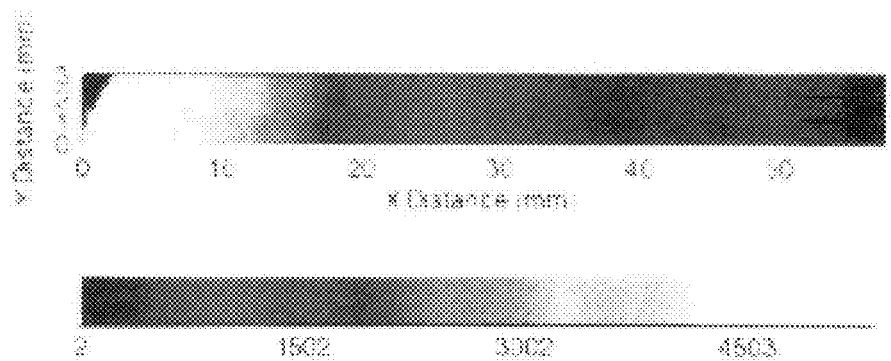
FIG. 4 is an image of μ-XRF map of the Zn distribution in a typical CZT slab grown by the Bridgman method.

A 22×55 mm$^2$ CZT slab was grown by the vertical Bridgman method. The multi-zone furnace is made up of two parts: a hot part for the growth chamber where T=1100° C. (the temperature homogeneity was controlled over 40 cm at 1100±0.5° C.) and a cold part where T=800° C. for controlling the cadmium vapor pressure. FIG. 4 is an image of a μ-XRF (X-ray fluorescence) map of Zn distribution in CZT slabs with an area of 22×55 mm$^2$. FIG. 4 shows the Zn distribution in a 3×55 mm$^2$ area of the CZT slab. The first-to freeze area (left) includes high Zn concentrations that decrease toward the last-to-freeze part (right). The bar indicates the counts of the Zn signal within the CZT slab. The Zn distribution is very similar to that predicted by typical segregation behavior.

The Zn composition mapping results for a CZT slab measured by the PL (photoluminescence) peak position of the dominant bound exciton agrees well with the μ-XRF measurement.

Example 2

Figure 5:
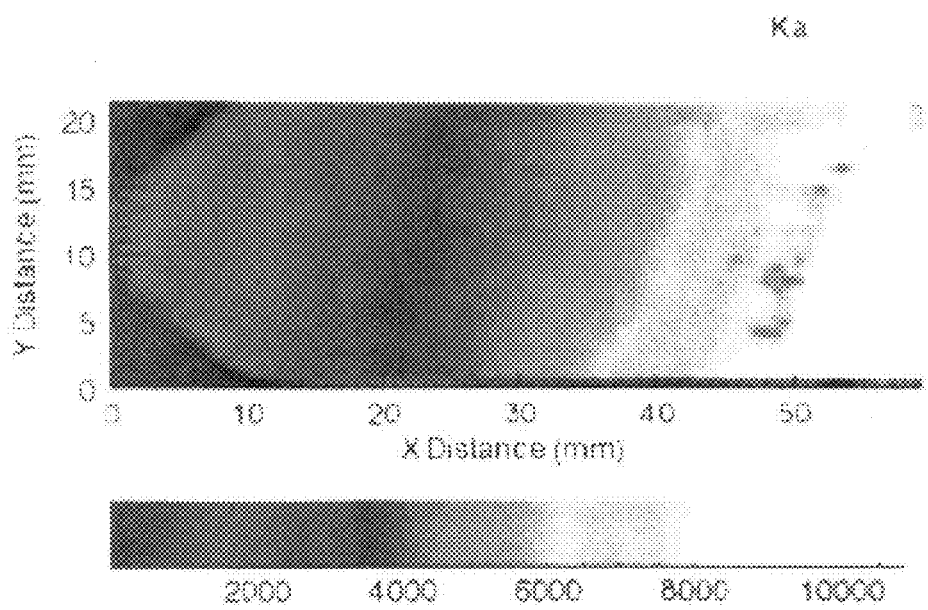
FIG. 5 is an image of a μ-XRF map of Zn distribution in in-situ-annealed CZT slabs prepared in a temperature-gradient of 10° C./cm and average temperature of 700° C.

The 22×60 mm$^2$ CZT slab was prepared from the annealed CZT ingots using the vertical Bridgman method under a temperature gradient of 10° C./cm at an average temperature of 750° C. for 140 hrs. The multi-zone furnace was made up of two parts: a hot part for the growth chamber where T=1100° C. (the temperature homogeneity was controlled over 40 cm at 1100±0.5° C.) and a cold part where T=800° C. for controlling the cadmium vapor pressure. The CZT slab revealed a completely different overall Zn distribution. As illustrated in FIG. 5, the Zn distribution was entirely opposite to that of the Zn distribution in CZT ingots shown in FIG. 4. The first-to freeze part includes a lower Zn concentration and it increased towards the last-to-freeze part. The Zn distribution was opposite to that depicted in FIG. 4.

Example 3

Figure 6:
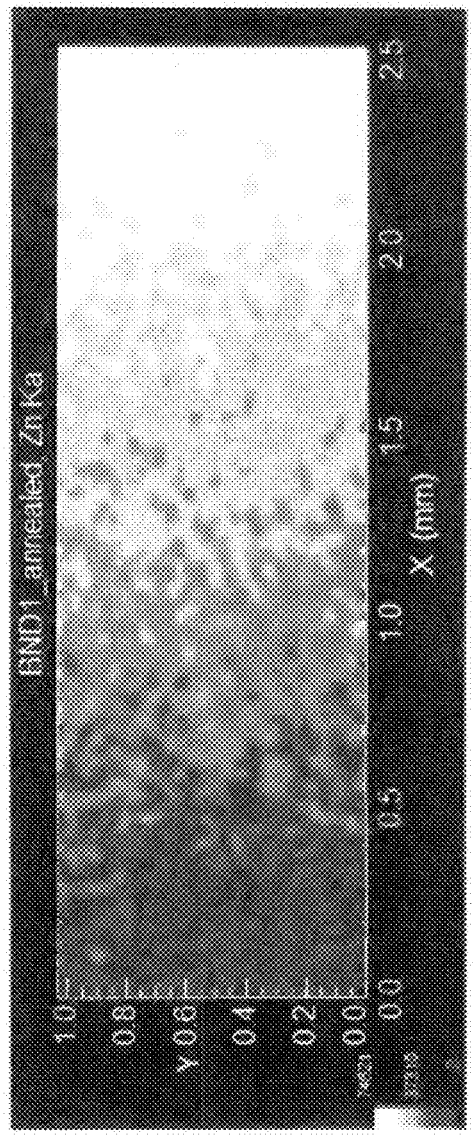
FIG. 6 is an image of a μ-XRF map of Zn distribution in a 1.0×2.5 mm$^2$ temperature-gradient annealed CZT wafer.

As illustrated in FIG. 6, similar Zn migration was also observed in a temperature-gradient annealed CZT wafer of 5×5-mm$^2$ at 700/650° C. The counts of Zn signal in this sample ranged from a high of 74000 to nearly zero. The CZT samples prepared from the grown CZT ingots have nearly uniform Zn distribution on a small scale of 5×5 mm$^2$. However, the Zn composition in annealed samples exhibits a much stronger deviation than that caused by segregation.

Example 4

For annealed CZT material, both on an ingot- and wafer-scale, the Zn concentration is high at regions exposed to high temperature. In a zinc-blend crystal structure, Cd and Zn occupy the same lattice point. The high temperature may induce relatively high Cd vacancies due to the higher vapor pressure of Cd compared to Zn and Te, and Zn may migrate through these Cd vacancies sites. The temperature gradient on the CZT wafers and ingots may induce a concentration gradient of Cd vacancies and provides the pathway for the Zn migration toward to the high Cd vacancies part, namely, the region of higher temperature.

It will be appreciated by persons skilled in the art that the disclosed application is not limited to what has been particularly shown and described hereinabove. Rather, the scope of the disclosed application is defined by the claims which follow. It should further be understood that the above description is only representative of illustrative examples of embodiments. For the reader's convenience, the above description has focused on a representative sample of possible embodiments, a sample that teaches the principles of the disclosed application. Other embodiments may result from a different combination of portions of different embodiments.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method of producing a material, the method comprising:
receiving a tertiary semiconductor (tSC) sample with a dilute species, wherein the tSC sample has two ends, a first end of the tSC sample includes a first concentration of the dilute species lower than a second concentration of the dilute species in a second end of the tSC sample; and
heating the tSC sample in a chamber, wherein the chamber has a first zone and a second zone, the first zone having a first temperature higher than a second temperature in the second zone, and the tSC sample is orientated such that the first end is in the first zone and the second end is in the second zone.

2. The method of claim 1, wherein:
the tertiary semiconductor sample includes Cd, Zn, and a group VI element; and Zn is the dilute species.

3. The method of claim 2, wherein the group VI element is Te or Se.

4. The method of claim 1, wherein a difference in temperature between the first zone and the second zone creates a temperature gradient along the tSC sample and a difference in temperature between the first zone and the second zone is about 50° C.

5. The method of claim 4, wherein the temperature gradient is about 10° C./cm at an average temperature of about 750° C.; and the method further comprises heating the tSC sample for about 140 hours.

6. The method of claim 1, where the method further comprises, prior to receiving the tSC sample:
placing a source material in an ampoule, where the source material includes Cd, Zn and Te;
placing the ampoule into a third zone of the chamber, wherein the third zone has a temperature effective to melt the source material to produce melted source material;
moving the ampoule into a fourth zone of the chamber, wherein the fourth zone has a temperature effective to solidify the melted source material to produce solidified source material; and moving the ampoule into a fifth zone of the chamber, wherein the fifth zone has a temperature effective to crystallize the solidified source material and form the tertiary semiconductor sample with the dilute species.

7. The method of claim 1, wherein after heating, a difference between a concentration of the dilute species in the first end of the tSC sample and a concentration of the dilute species in the second end of the sample does not exceed 2%.

8. The method of claim 1, further comprising cooling the tSC sample to about 20° C. at a rate of 10-30° C./h.

9. A material produced by the process of:
receiving a tertiary semiconductor (tSC) sample with a dilute species, wherein the tSC sample has two ends, a first end of the tSC sample includes a first concentration of the dilute species lower than a second concentration of the dilute species in a second end of the tSC sample; and
heating the tSC sample in a chamber, wherein the chamber has a first zone and a second zone, the first zone having a first temperature higher than a second temperature in the second zone, and the tSC sample is orientated such that the first end is in the first zone and the second end is in the second zone.

10. The material of claim 9, wherein:
the tSC sample includes Cd, Zn, and a group VI element; and
Zn is the dilute species.

11. The material of claim 10, wherein the group VI element is Te or Se.

12. The material of claim 9, wherein a difference in temperature between the first zone and the second zone creates a temperature gradient along the tSC sample and the difference in temperature between the first zone and the second zone is about 50° C., the temperature gradient is about 10° C./cm at an average temperature of about 750° C., and the process further comprises heating the tSC sample for about 140 hours.

13. The material of claim 9, further comprising cooling the tSC sample to about 20° C. at a rate of 10-30° C./h.

* * * * *